(12) United States Patent
Usuki

(10) Patent No.: US 7,142,472 B2
(45) Date of Patent: Nov. 28, 2006

(54) SEMICONDUCTOR MEMORY DEVICE AND METHOD FOR TESTING SAME

(75) Inventor: Narikazu Usuki, Tokyo (JP)

(73) Assignee: Elpida Memory, Inc., Tokyo (JP)

(\*) Notice: Subject to any disclaimer, the term of this patent is extended or adjusted under 35 U.S.C. 154(b) by 0 days.

(21) Appl. No.: 10/958,230

(22) Filed: Oct. 6, 2004

(65) Prior Publication Data
US 2005/0073891 A1  Apr. 7, 2005

(30) Foreign Application Priority Data
Oct. 7, 2003  (JP) .............................. 2003-348310

(51) Int. Cl.
*G11C 29/00* (2006.01)
(52) U.S. Cl. .................. 365/201; 365/203; 365/190
(58) Field of Classification Search ................ 365/201, 365/203, 190, 189.09
See application file for complete search history.

(56) References Cited

U.S. PATENT DOCUMENTS
6,147,916 A \* 11/2000 Ogura ......................... 365/203

FOREIGN PATENT DOCUMENTS
| JP | 6-60699 | 3/1994 |
| JP | 10-199298 | 7/1998 |
| JP | 2001-35197 | 2/2001 |

\* cited by examiner

*Primary Examiner*—Huan Hoang
(74) *Attorney, Agent, or Firm*—Whitham, Curtis, Christofferson & Cook, PC

(57) ABSTRACT

A semiconductor memory device having a sense amplifier for detecting data stored in a memory cell via a bit line pair connected to the memory cell, and voltage application means, an output voltage of which being adjustable, for applying the output voltage to the bit line pair so as to disturb potentials on the bit line pair.

5 Claims, 3 Drawing Sheets

SEMICONDUCTOR MEMORY DEVICE AND METHOD FOR TESTING SAME

BACKGROUND OF THE INVENTION

1. Field of the Invention

The present invention relates to a semiconductor memory device and method for testing same, and more particularly it relates to a semiconductor memory device having a disturb test function and a method for testing such a semiconductor memory device.

2. Related Art

Of the causes of failures in DRAMs, failures occurring at the time of sensing account for a large proportion, and are difficult to discern. Several causes of failures that can be cited are failure in the capacitance of a cell capacitor, charge leakage from a cell capacitor, decrease in the initial signal amount at the time of sense starting caused by sluggish operation of a word line, sense operation delay caused by insufficient capacity of a sense amplifier, erroneous sensing caused by a large high/low variation (unbalance) in sense amplifiers, and disturbance from a neighboring bit line or the like. In performing a shipping inspection, it is necessary to perform test patterns accommodating all of the above-noted causes for every memory cell, and with the increase in memory capacities and shrinking of memory design rules, the amount of time required for such testing is constantly increasing. Additionally, because of the difficulty in discerning failure factors, it is difficult to provide feedback of failure countermeasures to the manufacturing processes. The present invention enables the performance of testing separated from such problems as insufficient capacity of a sense amplifier, and large variations, and by doing so simplifies the distinguishing of failure factors, so that it is possible to provide quick feedback to the manufacturing processes. In addition, by performing a test in accordance with the present invention, it is possible to eliminate failures related to a sense amplifier from combinations of various failure factors, thereby enabling simplification of the test patterns, which shortens the testing time.

The Japanese Unexamined Patent Publication (KOKAI) No. 2001-35197 shows the semiconductor memory device having disturb test function. The above-mentioned publication does not shows disturb test performed for sense amplifiers.

An object of the present invention is to improve the above-noted drawbacks of the prior art and to provide a novel semiconductor memory device which enables testing of sense amplifiers when a disturb test is performed and to provide a method for testing same.

Another object of the present invention is that by performing disturb test on the sense amplifiers, sense amplifier problems are eliminated, thereby enabling simplification of the test patterns, which shortens the testing time.

SUMMARY OF THE INVENTION

In order to achieve the above-noted objects, the present invention adopts the following basic technical constitution.

Specifically, the first aspect of the present invention is a semiconductor memory device comprising: a sense amplifier for detecting data stored in a memory cell via a bit line pair connected to the memory cell; and voltage application means, an output voltage of which being adjustable, for applying the output voltage to the bit line pair so as to disturb potentials of the bit line pair.

The second aspect of the present invention is that the voltage application means comprises a first voltage generator and a second voltage generator, which output a different voltage each other, wherein an I/O line pair coupled to a write amplifier is connected to the bit line pair via a pair of column selection switches, and further wherein one line of the I/O line pair is connected to the first voltage generator via a first mode switch, which is controlled by a test mode signal, and another line of said I/O line pair is connected to the second voltage generator via a second mode switch, which is controlled by the test mode signal.

The third aspect of the present invention is that when a potential of one bit line of the bit line pair is higher than that of the other bit line of the bit line pair, the voltage application means applies the first disturb voltage to one bit line of the bit line pair, and the voltage application means applies to the other bit line of the bit line pair the second disturb voltage which is higher than the first disturb voltage.

The fourth aspect of the present invention is a method for testing a semiconductor memory device having a sense amplifier for detecting data stored in a memory cell via a bit line pair connected to the memory cell, the method comprising the steps of: writing data to the memory cell; applying a disturb voltage from a voltage generator to the bit line pair so as to disturb a potential on the bit line pair; and detecting data stored in the memory cell by the sense amplifier after stopping the disturb voltage applied to the bit line pair; wherein the data writing step, voltage applying step and potential detecting step are performed repeatedly, while varying the disturb voltage.

DETAILED DESCRIPTION OF THE PREFERRED EMBODIMENTS

The first embodiment of a semiconductor memory device and method for testing same according to the present invention are described in detail below, with reference made to FIG. 1 and FIG. 2.

The configuration of the semiconductor memory device according to the present invention is described first.

Figure 1:
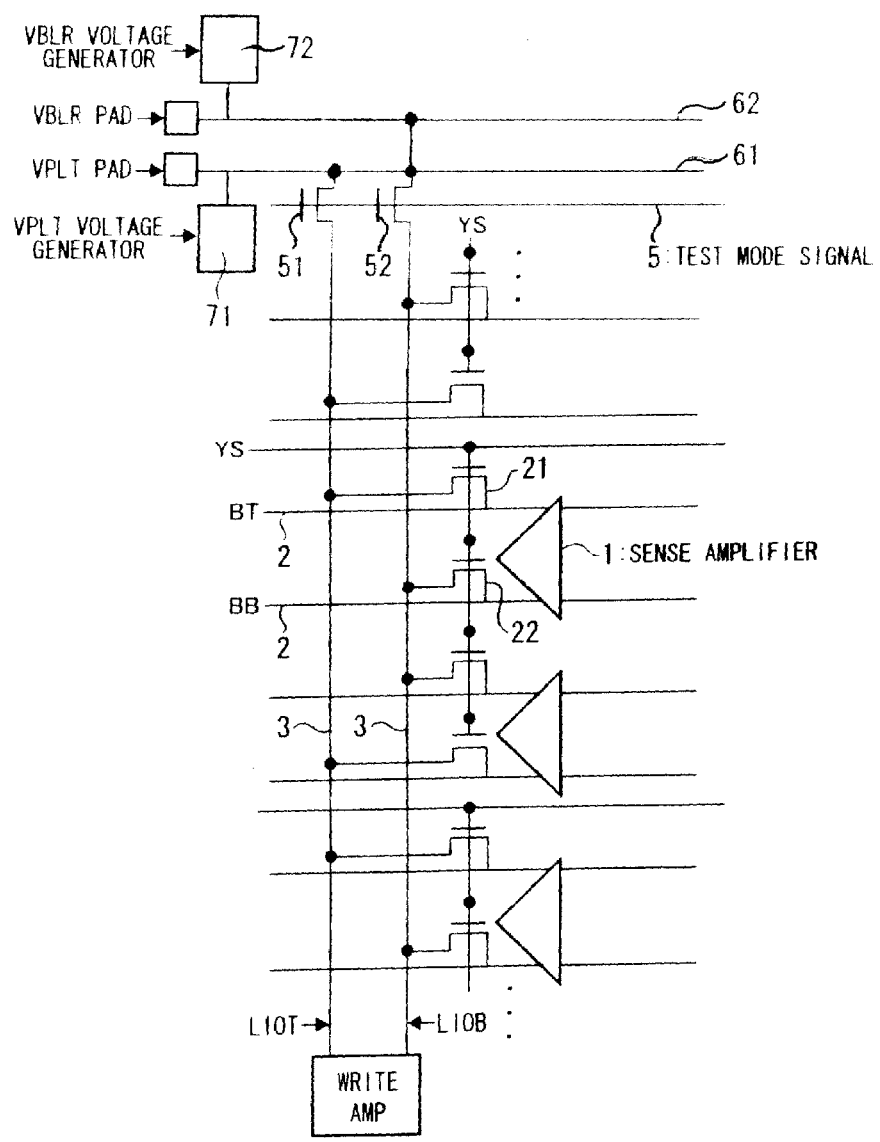
FIG. 1 is a circuit diagram of the main part of the first embodiment of a semiconductor memory device according to the present invention.

In FIG. 1, the reference numeral 1 denotes a sense amplifier, the reference numeral 2 is a bit line pair connected to a memory cell (not illustrated), this bit line pair 2 includes a True side bit line (BT in the drawing) and a Bar side bit line (BB in the drawing). The bit lines BT and BB are respectively connected to a local I/O line pair 3 LIOT, LIOB, via the transistors (column selection switches) 21, 22, a gate input of which is the Y address selection signal (YS in the drawing).

LIOT and LIOB of the local I/O pair 3 are respectively connected, via the transistors 51 and 52 that gate the input of the test mode signal line 5, to the cell opposing electrode level interconnect 61 (hereinafter VPLT) and the bit line balance level interconnect 62 (hereinafter VBLR). The VPLT 61 has a VPLT voltage generator 71 connected thereto, and the VBLR 62 has a VBLR voltage generator 72 connected thereto, the output voltages of the VPLT voltage generator 71 and the VPLR voltage generator 72 being adjustable so as to enable setting to an arbitrary voltage.

The method for testing a semiconductor memory device according to the present invention is described below.

Figure 2:
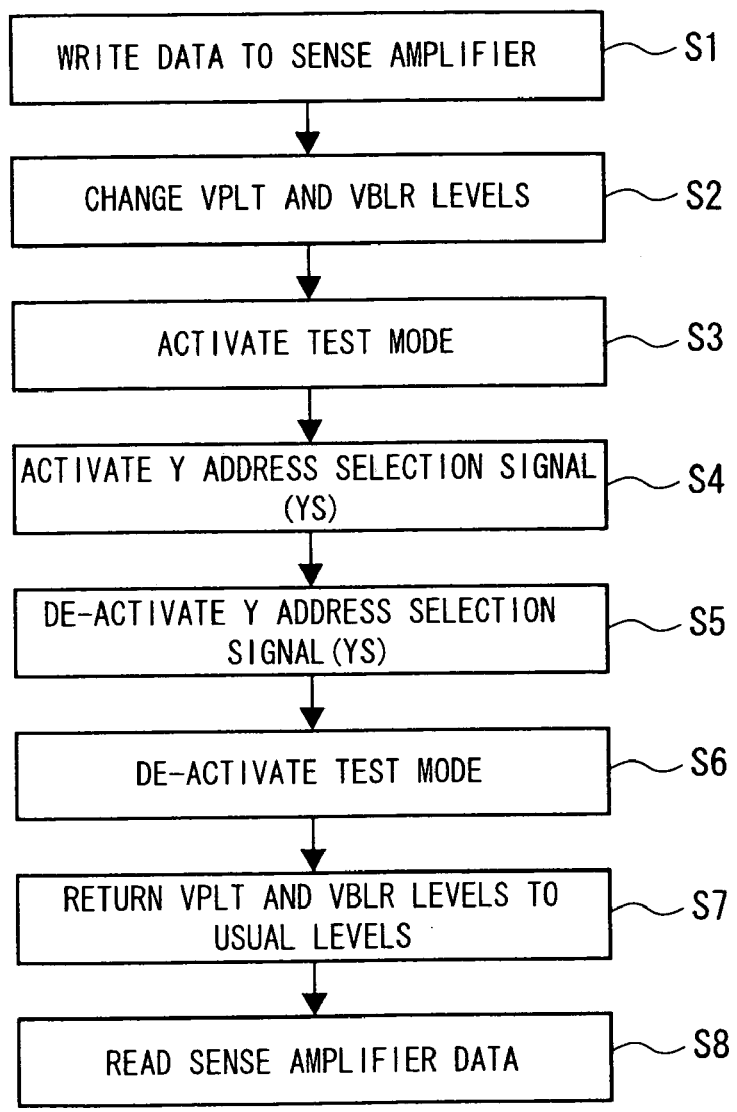
FIG. 2 is a drawing showing a flowchart of a method for testing a semiconductor memory device according to the present invention.

The present invention is used in sense amplifier testing, and the testing operational flow is shown in FIG. 2, the example shown therein being used below to describe the operation.

[1] First, data is written to the sense amplifier 1 by a usual write operation (step S1). The data written at this point will be used by the sense amplifier 1 to drive the bit line pair BT/BB after writing. In this example, data is written so that BT is high level and BB is low level.

[2] Next, with the sense amplifier 1 remaining activated, the VPLT level and VLLR level changed from their usual levels (½ array power supply level) (step S2). This level change can be made by such methods as the method of applying a voltage from an external power supply to each of the VPLT and VBLR pads, or the method of using the output voltages of the VPLT voltage generator 71 and VBLR voltage generator 72. The levels are selected in this embodiment such that the VPLT and VBLR levels after the change maintain the relationship VPLT<VBLR, the reason for this being described below.

[3] Next, the test mode signal 5 is activated, and the potentials-set at step S2 are applied from the VPLT interconnect 61 to LIOT and from the VBLR interconnect 62 to LIOB (step S3), respectively. At this stage, the relationship of the potentials between the LIOT and LIOB is LIOT<LIOB.

[4] Next, the Y address selection signal (YS in FIG. 1) is activated, and connection is made between the bit line pair 2 and the I/O line pair 3 (step S4). At this stage, BT and VPLT, and BB and VBLR are connected respectively, via the two transistors 51 and 52, so that VPLT drives BT and VBLR drives BB. In this embodiment, VPLT and VBLR perform driving of the voltages on the BT and BB lines of the bit line pair 2 such that BT<BB. The driving of the bit line pair 2 BT/BB from the sense amplifier 1 of step S1 is continued. In this embodiment, in contrast to the drive from the sense amplifier 1 such that BT>BB, the driving from VPLT and VBLR is in the reverse relationship. That is, the sense amplifier 1 of interest is being disturbed from VPLT and VBLR.

Therefore, a sense amplifier, for example, having a small current capacity, or a sense amplifier having a large variation, will be inverted by this disturbance. Stated differently, by appropriately selecting the VPLT and VBLR levels at step S2, it is possible to distinguish between properly functioning sense amplifiers and sense amplifiers having the above-noted problems.

[5] After the above, the Y address selection signal YS is de-activated, so as to separate the I/O line pair 3 from the bit line pair 2 (step S5), after which the test mode signal 5 is de-activated, so as to separate the I/O line pair 3 from VPLT and VLBR (step S6), the VPLT and VBLR levels are returned to the usual levels (step S7), and in this condition the sense amplifier reads the potential difference between the bit line pair 2 (step S8), thereby detecting an inverted sense amplifier, which is a sense amplifier with a problem.

Figure 3:
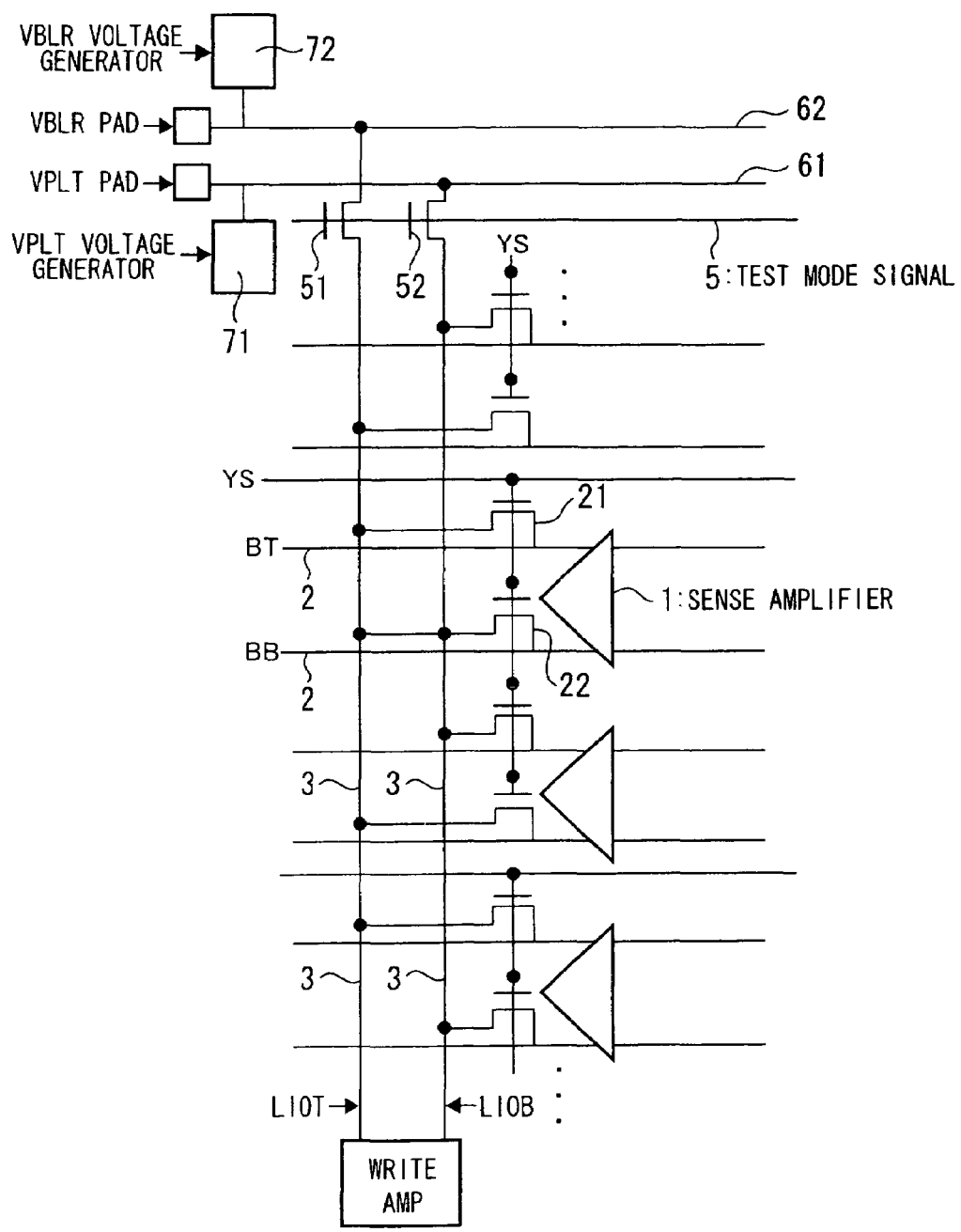
FIG. 3 is a circuit diagram showing the main part of the second embodiment of the present invention.

FIG. 3 shows a second embodiment of the present invention, in which the connections between LIOT and LIOB of the I/O line pair 2 and VPLT 61 and VBLR 62 are made in reverse from the connections of the first embodiment.

As described above, by applying a disturb test voltage to an activated sense amplifier via the local I/O line LIOT/B, and bit line pair BT/BB path from the cell opposing electrode (VPLT) interconnect and bit line balance level (VBLR) interconnect, it is possible to detect a sense amplifier exhibiting a problem. And by performing stepless adjustment of the disturb test voltage of the VPLT and VBLR disturb voltage generators, it is possible to perform detailed detection of sense amplifier problems, there by enabling simplification of the test pattern and shortening of the testing time.

In addition, because this is a DC-type application of the disturb voltage, control and practical application are facilitated.

What is claimed is:

1. A semiconductor memory device comprising:
    a sense amplifier for detecting data stored in a memory cell via a bit line pair connected to said memory cell; and
    voltage application means, an output voltage of which being adjustable, for applying said output voltage to said bit line pair so as to disturb potentials of said bit line pair,
    wherein said voltage application means comprises a first voltage generator and a second voltage generator, which output a different voltage from each other,
    wherein an I/O line pair coupled to a write amplifier is connected to said bit line pair via a pair of column selection switches,
    and further wherein one line of said I/O line pair is connected to the first voltage generator via a first mode switch, which is controlled by a test mode signal, and another line of said I/O line pair is connected to the second voltage generator via a second mode switch, which is controlled by said test mode signal.

2. The semiconductor memory device according to claim 1, wherein said first voltage generator is connected to a cell opposing electrode level interconnect and said second voltage generator is connected to a bit line balance level interconnect.

3. The semiconductor memory device according to claim 1, wherein said first voltage generator is connected to a bit line balance level interconnect, and said second voltage generator is connected to a cell opposing electrode level interconnect.

4. The semiconductor memory device according to claim 1, wherein when a potential of one bit line of said bit line pair is higher than that of the other bit line of said bit line pair, said voltage application means applies a first disturb voltage to one bit line of said bit line pair, and said voltage application means applies to the other bit line of said bit line pair a second disturb voltage which is higher than the first disturb voltage.

5. A method for testing a semiconductor memory device having a sense amplifier for detecting data stored in a memory cell via a bit line pair connected to said memory cell, said method comprising the steps of:
    writing data to said memory cell;
    applying a disturb voltage from a voltage generator to said bit line pair so as to disturb a potential on said bit line pair; and
    detecting data stored in said memory cell by said sense amplifier after stopping said disturb voltage applied to said bit line pair;
    wherein said data writing step, voltage applying step and potential detecting step are performed repeatedly, while varying said disturb voltage, wherein when a potential of one bit line of said bit line pair is higher than that of the other bit line of said bit line pair, said voltage generator applies a first disturb voltage to one bit line of said bit line pair, and said voltage generator applies to the other bit line of said bit line pair a second disturb voltage which is higher than the first disturb voltage.

* * * * *